(12) United States Patent
Wang et al.

(10) Patent No.: US 11,646,394 B2
(45) Date of Patent: May 9, 2023

(54) RADIATION-EMITTING SEMICONDUCTOR BODY AND SEMICONDUCTOR CHIP

(71) Applicant: OSRAM Opto Semiconductors GmbH, Regensburg (DE)

(72) Inventors: Xue Wang, Regensburg (DE); Markus Bröll, Cork (IE); Anna Nirschl, Regenstauf (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/480,532

(22) PCT Filed: Mar. 5, 2018

(86) PCT No.: PCT/EP2018/055340
§ 371 (c)(1),
(2) Date: Jul. 24, 2019

(87) PCT Pub. No.: WO2018/162409
PCT Pub. Date: Sep. 13, 2018

(65) Prior Publication Data
US 2019/0386175 A1  Dec. 19, 2019

(30) Foreign Application Priority Data

Mar. 7, 2017  (DE) ..................... 10 2017 104 719.0

(51) Int. Cl.
*H01L 33/14* (2010.01)
*H01L 33/02* (2010.01)
(Continued)

(52) U.S. Cl.
CPC ............ *H01L 33/14* (2013.01); *H01L 33/025* (2013.01); *H01L 33/06* (2013.01); *H01L 33/12* (2013.01);
(Continued)

(58) Field of Classification Search
CPC ....... H01L 33/025; H01L 33/06; H01L 33/12; H01L 33/14; H01L 33/305; H01L 33/405; H01L 33/44
See application file for complete search history.

(56) References Cited

U.S. PATENT DOCUMENTS 4,510,515 A * 4/1985 Kajita ................... H01L 33/025
257/87
4,656,636 A * 4/1987 Amann ..................... H01S 5/12
372/50.1
(Continued)

FOREIGN PATENT DOCUMENTS

CN    1141512 A    1/1997
CN    101009353 A    8/2007
(Continued)

OTHER PUBLICATIONS

Yen, C.-H. et al, "A New AlGaInP Multiple-Quantum-Well Light-Emitting Diode With a Thin Carbon-Doped GaP Contact Layer Structure," *IEEE Photonics Technology Letters* 20(23): pp. 1923-1925. Oct. 31, 2008. https://ieeexplore.ieee.org/document/4663521. Abstract Only.
(Continued)

*Primary Examiner* — Jay C Kim
(74) *Attorney, Agent, or Firm* — DLA Piper LLP (US)

(57) ABSTRACT

A radiation-emitting semiconductor body having a semiconductor layer sequence includes an active region that generates radiation, an n-conducting region and a p-conducting region, wherein the active region is located between the n-conducting region and the p-conducting region, the p-conducting region includes a current expansion layer based on a phosphide compound semiconductor material, and the current expansion layer is doped with a first dopant incorporated at phosphorus lattice sites.

10 Claims, 2 Drawing Sheets

(51) Int. Cl.
 H01L 33/06 (2010.01)
 H01L 33/12 (2010.01)
 H01L 33/30 (2010.01)
 H01L 33/40 (2010.01)
 H01L 33/44 (2010.01)
(52) U.S. Cl.
 CPC .......... *H01L 33/305* (2013.01); *H01L 33/405* (2013.01); *H01L 33/44* (2013.01)

(56) References Cited

U.S. PATENT DOCUMENTS

| | | | |
|---|---|---|---|
| 4,815,087 A * | 3/1989 | Hayashi | B82Y 20/00 372/45.01 |
| 5,008,718 A | 4/1991 | Fletcher et al. | |
| 5,164,956 A * | 11/1992 | Lang | H01S 5/187 372/20 |
| 5,406,093 A * | 4/1995 | Endo | H01L 33/305 257/101 |
| 5,448,581 A * | 9/1995 | Wu | H01S 5/187 372/45.01 |
| 5,529,938 A * | 6/1996 | Umeda | H01L 33/305 117/56 |
| 5,814,839 A | 9/1998 | Hosoba | |
| 5,926,493 A * | 7/1999 | O'Brien | G02B 6/124 385/37 |
| 5,986,288 A * | 11/1999 | Hasegawa | H01L 33/0062 117/13 |
| 6,048,397 A * | 4/2000 | Endo | H01L 33/305 117/102 |
| 6,057,563 A | 5/2000 | Chen et al. | |
| 6,121,635 A * | 9/2000 | Watanabe | H01L 33/145 257/102 |
| 6,144,044 A * | 11/2000 | Yoshinaga | H01L 33/305 257/94 |
| 6,207,972 B1 * | 3/2001 | Chen | H01L 33/02 257/101 |
| 6,323,507 B1 * | 11/2001 | Yokoyama | H01S 5/227 372/49.01 |
| 6,479,312 B1 * | 11/2002 | Yamada | H01L 33/025 438/46 |
| 6,777,257 B2 * | 8/2004 | Shinohara | H01L 33/025 438/45 |
| 6,815,736 B2 * | 11/2004 | Mascarenhas | H01L 31/0687 257/201 |
| 7,122,846 B2 * | 10/2006 | Kish, Jr. | H01S 5/227 257/97 |
| 7,132,695 B2 * | 11/2006 | Ou | H01L 33/025 257/103 |
| 7,135,709 B1 | 11/2006 | Wirth et al. | |
| 7,193,246 B1 * | 3/2007 | Tanizawa | B82Y 20/00 257/101 |
| 7,496,025 B2 * | 2/2009 | Isshiki | B82Y 20/00 369/121 |
| 7,608,859 B2 * | 10/2009 | Konno | H01L 33/14 257/102 |
| 7,622,745 B2 * | 11/2009 | Suzuki | B82Y 20/00 257/102 |
| 7,652,281 B2 * | 1/2010 | Takahashi | H01L 33/025 257/13 |
| 7,852,890 B2 * | 12/2010 | Matsuda | B82Y 20/00 372/43.01 |
| 7,960,745 B2 * | 6/2011 | Suzuki | H01L 24/05 257/96 |
| 7,968,362 B2 * | 6/2011 | Takahashi | C23C 16/301 438/47 |
| 8,115,192 B2 * | 2/2012 | Kondo | H01L 33/0093 257/13 |
| 8,154,042 B2 * | 4/2012 | Aldaz | H01L 33/145 257/98 |
| 8,174,025 B2 * | 5/2012 | Epler | H01L 33/16 257/E33.068 |
| 8,373,152 B2 * | 2/2013 | Song | H01L 33/14 257/E33.066 |
| 8,450,767 B2 * | 5/2013 | Fu | H01L 33/22 257/99 |
| 8,618,551 B2 * | 12/2013 | Nishikawa | H01L 33/38 257/76 |
| 8,704,252 B2 * | 4/2014 | Wang | H01L 33/06 257/97 |
| 9,299,886 B2 | 3/2016 | Furhmann et al. | |
| 9,412,904 B2 | 8/2016 | Desieres et al. | |
| 9,543,467 B2 * | 1/2017 | Song | H01L 33/14 |
| 9,673,354 B2 * | 6/2017 | Moon | H01L 33/405 |
| 10,043,947 B2 * | 8/2018 | Ko | H01L 33/02 |
| 10,109,768 B2 * | 10/2018 | Wu | H01L 33/06 |
| 10,177,274 B2 * | 1/2019 | Kim | H01L 33/04 |
| 10,224,457 B2 * | 3/2019 | Kharas | H01L 33/06 |
| 2002/0104997 A1 * | 8/2002 | Kuo | H01L 33/0062 257/79 |
| 2003/0086467 A1 * | 5/2003 | Modak | H01L 33/105 438/22 |
| 2004/0155248 A1 * | 8/2004 | Fukuda | H01L 33/04 257/94 |
| 2004/0206963 A1 | 10/2004 | Chang et al. | |
| 2007/0069196 A1 | 3/2007 | Kako et al. | |
| 2010/0219436 A1 | 9/2010 | Watanabe | |
| 2013/0221367 A1 * | 8/2013 | Furuki | H01L 33/22 257/76 |
| 2019/0386174 A1 * | 12/2019 | Wang | H01L 21/041 |

FOREIGN PATENT DOCUMENTS

| | | |
|---|---|---|
| CN | 101030615 A | 9/2007 |
| CN | 101388430 A | 3/2009 |
| CN | 101878541 A | 11/2010 |
| CN | 103579435 A | 2/2014 |
| CN | 103887384 A | 6/2014 |
| CN | 104160518 A | 11/2014 |
| DE | 10253160 A1 | 3/2004 |
| EP | 2 009 706 A1 | 12/2008 |
| EP | 2 743 996 A2 | 6/2014 |
| EP | 2 903 027 A1 | 8/2015 |
| EP | 2 950 355 A1 | 12/2015 |
| JP | 2000-312028 A | 11/2000 |
| WO | WO 2016/073678 * 5/2016 ............ H01L 33/10 |  |

OTHER PUBLICATIONS

Fletcher, R.M. et al, "The growth and properties of high performance AlGaInP emitters using a lattice mismatched GaP window layer," *Journal of Electronic Materials* 20(12): pp. 1125-1130. Dec. 1991. https://link.springer.com/article/10.1007%2FBF03030219. Abstract Only.

The First Office Action dated Dec. 2, 2021, of Chinese Patent Application No. 201880016159.9, along with an English translation.

The Third Office Action dated Dec. 21, 2022, of Chinese Patent Application No. 201880016159.9, along with an English machine translation.

* cited by examiner

RADIATION-EMITTING SEMICONDUCTOR BODY AND SEMICONDUCTOR CHIP

TECHNICAL FIELD

This application relates a radiation emitting semiconductor body and a semiconductor chip comprising such a semiconductor body.

BACKGROUND

In radiation-emitting semiconductor chips based on phosphide compound semiconductor material, AlGaAs layers are often used for current expansion on the p side. However, these layers can corrode, which can lead to failure of the semiconductor chip. In addition, such layers show a comparatively high absorption for the light to be generated in the semiconductor chip. Alternatively, GaP doped with magnesium can be used. Although this avoids susceptibility to moisture, a significantly worse specific resistance is achieved than with AlGaAs. In addition, magnesium can diffuse into the active region and form defects, leading to light loss.

There is thus a need to provide good current expansion with low absorption losses and high moisture stability at the same time.

SUMMARY

We provide a radiation-emitting semiconductor body having a semiconductor layer sequence including an active region that generates radiation, an n-conducting region and a p-conducting region, wherein the active region is located between the n-conducting region and the p-conducting region, the p-conducting region includes a current expansion layer based on a phosphide compound semiconductor material and the current expansion layer is doped with a first dopant incorporated at phosphorus lattice sites.

We also provide a radiation-emitting semiconductor body having a semiconductor layer sequence including an active region that generates radiation, an n-conducting region and a p-conducting region, wherein the active region is located between the n-conducting region and the p-conducting region, the p-conducting region includes a current expansion layer based on a phosphide compound semiconductor material, the current expansion layer is doped with a first dopant incorporated at phosphorus lattice sites, the first dopant is carbon, the current expansion layer is lattice-mismatched with respect to a semiconductor material adjacent to a side facing the active region and is partially or completely relaxed; and the p-conducting region has a subregion between the current expansion layer and the active region, and the subregion is p-conductively doped with a second dopant different from the first dopant.

We further provide a radiation-emitting semiconductor body having a semiconductor layer sequence including an active region that generates radiation, an n-conducting region and a p-conducting region, wherein the active region is located between the n-conducting region and the p-conducting region, the p-conducting region includes a current expansion layer based on a phosphide compound semiconductor material, the current expansion layer is doped with a first dopant incorporated at phosphorus lattice sites, the p-conducting region has a subregion between the current expansion layer and the active region, and the subregion is p-conductively doped with a second dopant different from the first dopant; and a superlattice structure is disposed between the current expansion layer and the active region.

Figure 1A:
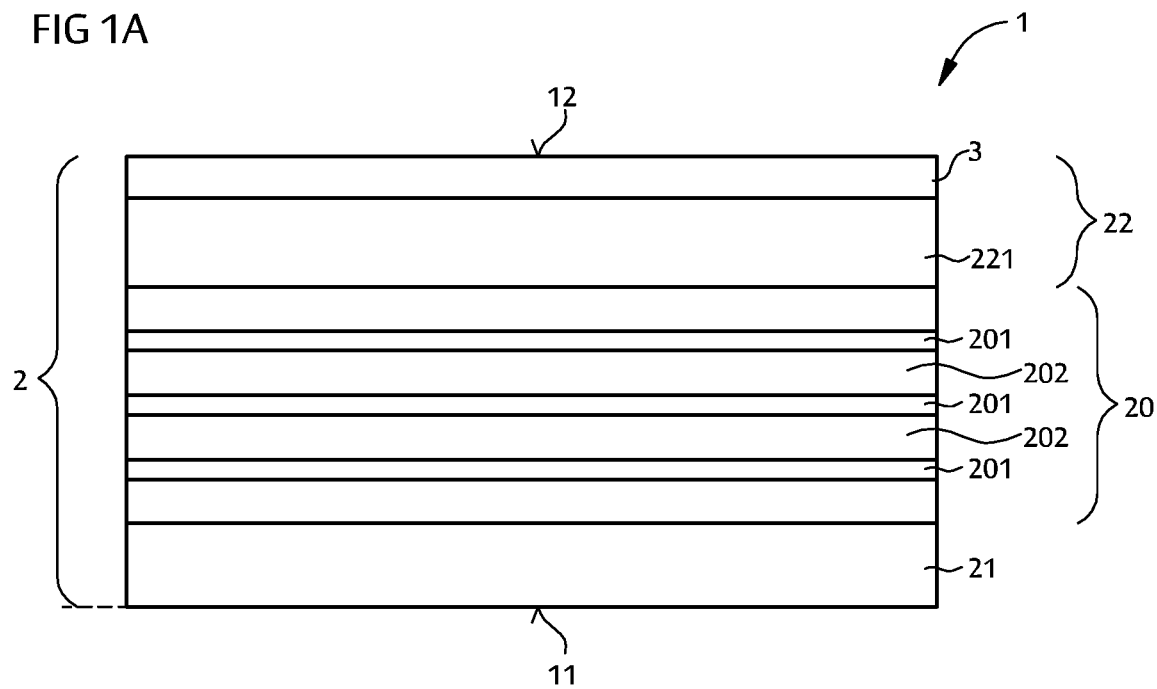
FIG. 1A shows an example of a semiconductor body in schematic cross-sectional view.

REFERENCE SIGN LIST 1 semiconductor body
10 semiconductor chip
11 first main surface
12 second main surface
2 semiconductor layer sequence
20 active region
201 quantum layer
202 barrier layer
21 n-conducting region
22 p-conducting region
221 subregion
3 current expansion layer
35 recess
45 superlattice
451 first sublayer
452 second sublayer
5 mirror layer
51 contact layer
55 dielectric layer
550 opening
6 connecting layer
7 carrier
81 first contact
82 second contact

DETAILED DESCRIPTION

We provide a radiation-emitting semiconductor body with a semiconductor layer sequence. In the vertical direction, i.e. perpendicular to a main extension plane of the semiconductor layers of the semiconductor layer sequence, the semiconductor body extends between a first main surface and a second main surface. In particular, the semiconductor layer sequence is epitaxially deposited, for example, by MOCVD or MBE. The semiconductor layer sequence forms in particular the semiconductor body so that all layers of the semiconductor body have epitaxial material. In other words, the entire semiconductor body consists of crystalline material.

The semiconductor layer sequence may have an active region provided to generate radiation, an n-conducting region and a p-conducting region, the active region being located between the n-conducting region and the p-conducting region. The active region is therefore in a pn transition.

The active region is intended in particular to generate radiation in the green, yellow, red or infrared spectral range.

The active region may be based on a phosphide compound semiconductor material or on an arsenide compound semiconductor material.

Based on "phosphide compound semiconductor material" means that the material comprises or consists of a phosphide compound semiconductor material, preferably $Al_xIn_yGa_{1-x-y}P$, wherein $0 \leq x \leq 1$, $0 \leq y \leq 1$ and $x+y \leq 1$. This material does not necessarily have to have a mathematically exact composition according to the above formula. Rather, it may, for example, contain one or more dopants and additional components. For simplicity's sake, however, the above formula contains only the essential components of the crystal lattice (Al, Ga, In, P), even if they may be partially replaced and/or supplemented by small amounts of other substances.

Based on "arsenide compound semiconductor material" means that the material is an arsenide compound semiconductor material, preferably AlxInyGa1-x-yAs, where $0 \leq x \leq 1$, $0 \leq y \leq 1$ and $x+y \leq 1$. This material does not necessarily have to have a mathematically exact composition according to the above formula. Rather, it may, for example, contain one or more dopants and additional components. For simplicity's sake, however, the above formula contains only the essential components of the crystal lattice (Al, Ga, In, As), even if they may be partially replaced and/or supplemented by small amounts of other substances.

The p-conducting region may comprise a current expansion layer. The current expansion layer is therefore part of the semiconductor body. The current expansion layer is formed in particular on the side of the p-conducting region facing away from the active region. For example, the current expansion layer forms the second main surface of the semiconductor body.

The current expansion layer may be doped with a first dopant. The first dopant in particular causes p-doping. In other words, the first dopant acts as an acceptor. For example, the first dopant is incorporated at Group V lattice sites, in particular phosphorus lattice sites.

The radiation emitting semiconductor body may have a semiconductor layer sequence comprising an active region provided to generate radiation, an n-conducting region and a p-conducting region, wherein the active region is located between the n-conducting region and the p-conducting region. The p-conducting region comprises a current expansion layer based on a phosphide compound semiconductor material. The current expansion layer is doped with a first dopant incorporated at phosphorus lattice sites.

Such a current expansion layer can be used to realize a semiconductor body characterized by improved moisture stability and lower absorption losses compared to a semiconductor body with an AlGaAs current expansion layer. Furthermore, a high conductivity and thus an efficient current expansion can be achieved.

The first dopant may be a Group IV element. Such an element acts as an acceptor by being incorporated at a Group V lattice spite such as a phosphorus lattice site.

For example, the first dopant is carbon. Carbon is characterized by particularly low diffusion within the semiconductor body. The danger of damage to the semiconductor body, especially the active region, due to diffusion of the first dopant into the active region and the associated loss of light of the semiconductor body is efficiently avoided.

For example, the current expansion layer has a doping concentration of $1 \times 10^{17}$ cm$^{-3}$ to $1 \times 10^{21}$ cm$^{-3}$, for example, $5 \times 10^{19}$ cm$^{-3}$ to $5 \times 10^{20}$ cm$^{-3}$.

The current expansion layer may be lattice-mismatched with respect to a semiconductor material of the semiconductor body adjacent to a side facing the active region and is partially or completely relaxed. This means that the current expansion layer is deposited with its intrinsic lattice constant, although the intrinsic lattice constant is different from the lattice constant of the underlying semiconductor material. The material of the current expansion layer thus has a different lattice constant in the semiconductor body than the underlying material of the semiconductor body.

Contrary to the usual efforts to avoid relaxation, a current expansion layer is used that does not have the same lattice constant as the underlying semiconductor material and does not grow under pressure or tension. Despite relaxation of the current expansion layer, the semiconductor body is characterized overall by improved properties.

The current expansion layer may comprise $Al_xIn_yGa_{1-x-y}P$ with $0 \leq x \leq 0.05$ and $0 \leq y \leq 0.05$. The current expansion layer therefore has no aluminium or at least only a low aluminium content y. An efficient installation of a Group IV element such as carbon on phosphorus lattice sites is thus simplified. Furthermore, the current expansion layer has no or only comparatively little indium.

In the radiation-emitting semiconductor body, x=0 and y=0 may apply. The current expansion layer is thus formed by GaP and contains at least nominally neither aluminium nor indium.

The p-conducting region may have a subregion between the current expansion layer and the active region. In particular, the subregion is doped p-conductively with a second dopant different from the first dopant.

The p-conducting region thus has two regions that are doped with different dopants. For example, the first dopant is not present in the subregion. Furthermore, for example, the second dopant is not present in the current expansion layer. For example, both the current expansion layer and the subregion have only one dopant.

The second dopant may be incorporated at Group III lattice sites. For example, the second dopant is a Group II element such as magnesium. The second dopant thus acts as an acceptor.

A superlattice structure may be disposed between the current expansion layer and the active region. For example, the superlattice structure is arranged between the current expansion layer and the subregion. By the superlattice structure, the danger of propagation of crystal defects starting from the current expansion layer in the direction of the active region can be further suppressed.

For example, the superlattice structure comprises a plurality of first sublayers and a plurality of second sublayers, the first sublayers and the second sublayers being different with respect to the material. The layer thicknesses of the first sublayers and the second sublayers are expediently so small that each layer thickness is below their critical layer thickness and thus no relaxation occurs. The critical layer thickness is the layer thickness above which relaxation occurs with lattice-mismatched material so that the lattice-mismatched material no longer takes the lattice constant of the underlying material.

All layers of the semiconductor layer sequence except the current expansion layer may be lattice-matched. "Lattice-matched" means in particular that the relative deviation between the lattice constants is not more than 2%. In other words, the current expansion layer is the only relaxed semiconductor layer within the semiconductor layer sequence. The remaining layers are either lattice-matched with respect to the growth substrate, for example, gallium arsenide or they grow tension-stressed or compression-stressed.

The current expansion layer may be structured in a lateral direction, i.e. in a direction running along a main extension plane of the semiconductor layers of the semiconductor layer sequence. For example, the current expansion layer has at least one recess. In the lateral direction, for example, the recess is completely surrounded by the material of the current expansion layer.

We also provide a radiation-emitting semiconductor chip with such a semiconductor body.

The semiconductor chip may comprise a carrier on which the semiconductor body is disposed.

The carrier may be different from a growth substrate for the semiconductor body. In particular, the carrier also mechanically stabilizes the semiconductor body so that the growth substrate is no longer required and can be removed. In contrast to the growth substrate, the carrier does not have to meet the high crystalline requirements of a growth substrate and can be selected with regard to other criteria such as radiation transmittance for radiation to be generated in the active region, electrical or thermal conductivity or low-cost availability.

A mirror layer may be disposed between the carrier and the semiconductor body. The mirror layer is especially designed as a metallic mirror layer. For example, gold is characterized by high reflectivity in the visible and infrared spectral range. Radiation emitted in the direction of the carrier is reflected back by the mirror layer. A material can therefore also be used for the carrier that would absorb the radiation generated during operation in the active region.

The carrier may be transparent to the radiation generated in the active region and during operation of the semiconductor chip at least some of the radiation exits through the carrier, in particular also from at least one side surface of the carrier.

Further configurations and functionalities result from the following description of the examples in connection with the figures.

Same, similar or seemingly similar elements are provided in the figures with the same reference signs.

The figures are schematic representations and therefore not necessarily true to scale. Rather, comparatively small elements and, in particular, layer thicknesses can be displayed exaggeratedly large for clarification.

An example of a radiation-emitting semiconductor body 1 is shown in FIG. 1A in a schematic cross-sectional view. The semiconductor body 1 is formed by a semiconductor layer sequence 2. For example, the semiconductor layer sequence 2 is epitaxially deposited on a growth substrate, for example, on gallium arsenide. The growth substrate is not explicitly shown in FIG. 1A.

In the vertical direction, i.e. perpendicular to a main extension plane of the semiconductor layers of the semiconductor layer sequence 2, the semiconductor body 1 extends between a first main surface 11 and a second main surface 12.

The semiconductor layer sequence 2 has an active region 20 intended to generate radiation, which is arranged between an n-conducting region 21 and a p-conducting region 22.

The active region 20 is based on a phosphide compound semiconductor material or an arsenide compound semiconductor material. For example, the active region 20 is formed as a quantum structure with a plurality of quantum layers 201 and barrier layers 202 arranged between them. By selecting the material composition of the phosphide compound semiconductor material or the arsenide compound semiconductor material and/or the layer thickness of the quantum layers 201, the emission wavelength of the radiation to be generated in the active region can be varied from the green to the yellow and red to the infrared spectral range.

The p-conducting region 22 has a current expansion layer 3.

The current expansion layer 3 forms the second main surface 12. The current expansion layer terminates the semiconductor body 1 on the p-side of the active region 20.

The current expansion layer 3 is doped with a first dopant installed at phosphorus lattice sites, for example, with a Group IV element. Carbon is particularly suitable as the first dopant since high doping concentrations and thus high electrical conductivities are achieved with carbon. Furthermore, the diffusion of carbon is lower than that of other p-dopants incorporated at Group III lattice sites such as magnesium. Carbon thus does not cause any defects in the active region. A high stable efficiency can thus be achieved in a simplified way. For example, the current expansion layer has a doping concentration of $1 \times 10^{17}$ cm$^{-3}$ to $1 \times 10^{21}$ cm$^{-3}$, for example, $1 \times 10^{19}$ cm$^{-3}$ to $5 \times 10^{20}$ cm$^{-3}$.

In particular, carbon-doped GaP material is suitable for the current expansion layer 3. However, the current expansion layer 3 may also contain small amounts of aluminium and/or indium, for example, with an aluminium content $x \leq 0.05$ and an indium content $y \leq 0.05$.

Such a current expansion layer 3 is characterized by a high transmission in the spectral ranges mentioned above for the radiation to be generated in the active region 20. In addition, such a current expansion layer is more moisture stable than an AlGaAs current expansion layer.

The current expansion layer 3 forms the second main surface 12 of the semiconductor body 1. Between the active region 20 and the current expansion layer 3, the p-conducting region 22 has a subregion 221. For example, a phosphide compound semiconductor material with an aluminium content of 0.4 to 0.5 is suitable for subregion 221.

In contrast to the other layers of semiconductor layer sequence 2, the current expansion layer 3 is completely or partially relaxed and therefore does not have the lattice constant of the growth substrate, i.e. gallium arsenide. All semiconductor layers of the semiconductor layer sequence arranged on the side of the current expansion layer 3 facing the active region 20 therefore have the same lattice constant.

The p-conducting region 22 also has a subregion 221 on the side of the current expansion layer 3 facing the active region 20. The subregion 221 is doped p-conductively by a second dopant. In particular, the second dopant is different from the first dopant. For example, a Group II element installed at Group III grid sites and acts as an acceptor such as magnesium is suitable.

Figure 1B:
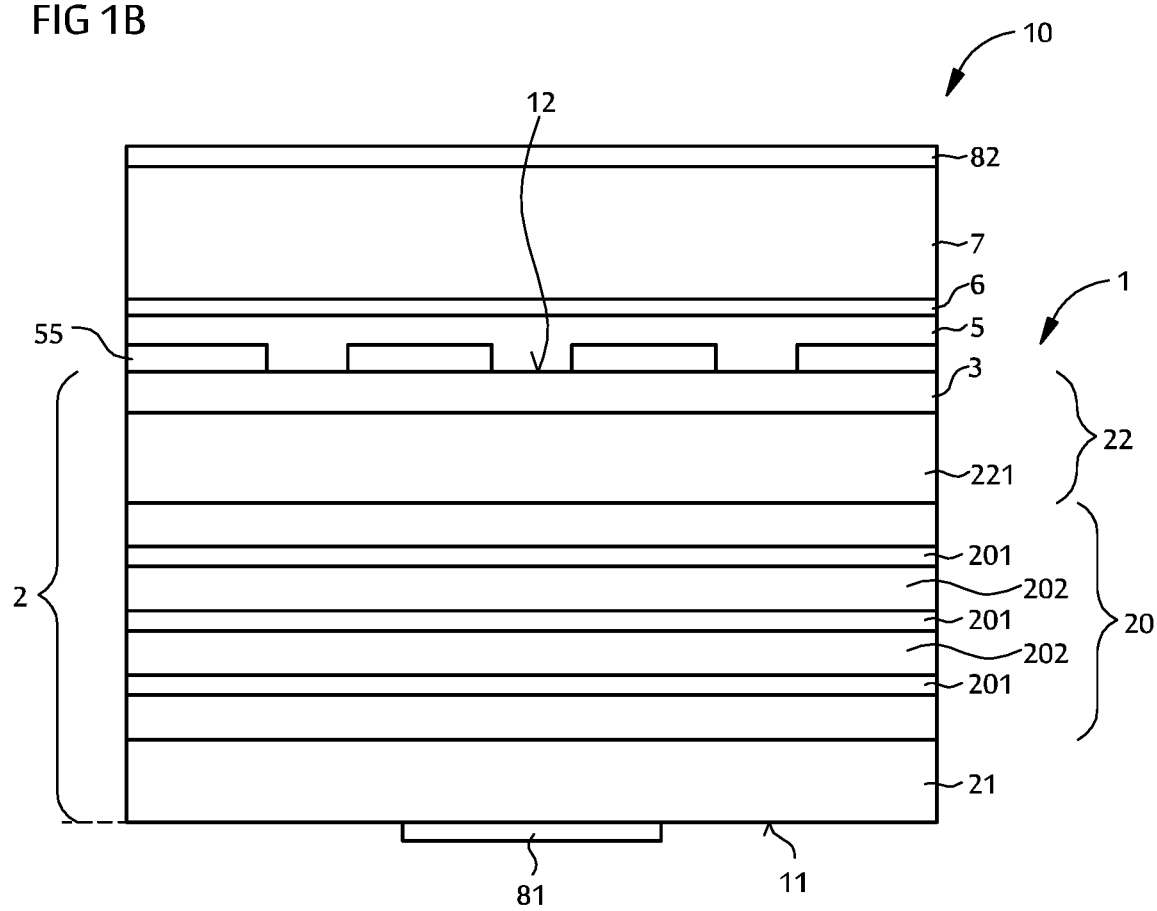
FIG. 1B shows an example of a semiconductor chip with a semiconductor body in schematic cross-sectional view.

FIG. 1B shows a semiconductor chip 10 with such a semiconductor body 1. The semiconductor chip 10 has a carrier 7 on which the semiconductor body 1 with the semiconductor layer sequence 2 is arranged. The carrier 7 is attached to the semiconductor layer sequence 2 by a connecting layer 6 such as a solder layer or an electrically conductive adhesive layer.

In the example shown, a mirror layer 5 is arranged between the carrier 7 and the semiconductor layer sequence 2. The mirror layer 5 serves at the same time for the electrical contacting of the current expansion layer 3. Between the mirror layer 5 and the current expansion layer 3 a dielectric layer 55 is arranged in places. The dielectric layer has one or more openings 550 in which the mirror layer electrically connects to the current expansion layer. The mirror layer thus does not fully border on the second main surface 12. Radiation emitted in the active region 20 at comparatively large angles to the vertical direction can be totally reflected at the dielectric layer 55 so that these portions of radiation are mostly reflected without loss and can subsequently emerge from the semiconductor chip 10. Silicon oxide, for example, is suitable for the dielectric layer 55.

It turned out that the current expansion layer 3 described above is also characterized by improved adhesion to such a dielectric layer 55. This further increases the reliability of the semiconductor chip 10.

For external electrical contacting of the semiconductor chip 10, the semiconductor chip has a first contact 81 and a second contact 82. In the example shown, the second contact is located on the side of the carrier 7 opposite to the semiconductor layer sequence 2. The first contact 81 is arranged on the first main surface 11 of semiconductor body 1 and connected to the n-conducting region 21.

However, the arrangement of the first and second contacts can be varied within wide limits as long as charge carriers from opposite sides enter the active region 20 by applying an external electrical voltage between the first contact 81 and the second contact 82 and can recombine there under emission of radiation.

By the mirror layer 6, radiation emitted in the direction of the carrier 7 is reflected back into the semiconductor body 1. The carrier 7 itself therefore does not have to be transparent to the radiation generated in the active region 20. For example, a semiconductor material such as silicon or germanium is suitable for the carrier. During operation of the semiconductor chip, the radiation mainly exits at the first main surface 11 facing away from the carrier. Such a semiconductor chip is in good approximation a surface emitter with a Lambert radiation characteristic.

Deviating from the example described, however, the mirror layer 5 can also be dispensed with. In this example, a radiation-transmissive material is particularly suitable for carrier 7 so that the radiation generated in the active region 20 can exit the semiconductor chip 10 through carrier 7 such as GaP. In particular, the radiation can at least partially exit through at least one side surface of the carrier. A semiconductor chip in which a significant portion of the radiation, for example, at least 30% of the radiation, also exits at side surfaces of the semiconductor chip, is also referred to as a volume emitter.

Figure 1C:
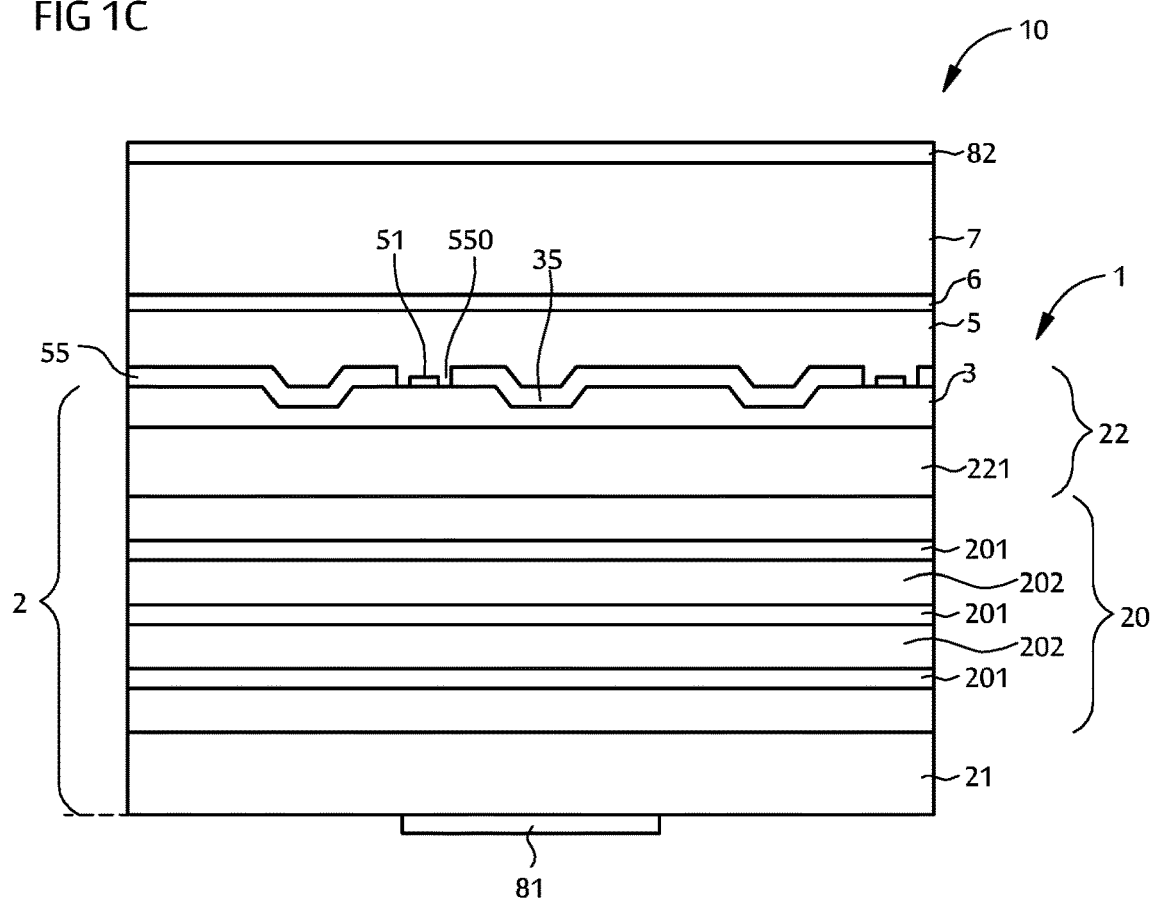
FIG. 1C shows an example of a semiconductor chip with a semiconductor body in schematic cross-sectional view.

FIG. 1C shows another example of a semiconductor chip. This example essentially corresponds to the example described in FIG. 1B. In contrast, the current expansion layer 3 has a structuring in a lateral direction. The structuring is formed in the form of a plurality of recesses 35 in the current expansion layer. The recesses are intended, for example, for a disturbance of waveguide effects in semiconductor body 2. The decoupling efficiency can thus be increased. In the example shown, the recesses 35 of the current expansion layer 3 and the openings 550 of the dielectric layer 55 are laterally spaced from each other. However, the recesses 35 and the openings 550 may also be arranged next to each other in a completely or at least partially overlapping manner in plan view. A contact layer 51 for electrical contacting of the current expansion layer 3 is arranged in the openings 550. Seen in a vertical direction, the contact layer is arranged in places between the current expansion layer 3 and the mirror layer 5. Such a contact layer can also be used in the other example, but is not absolutely necessary.

Figure 2:
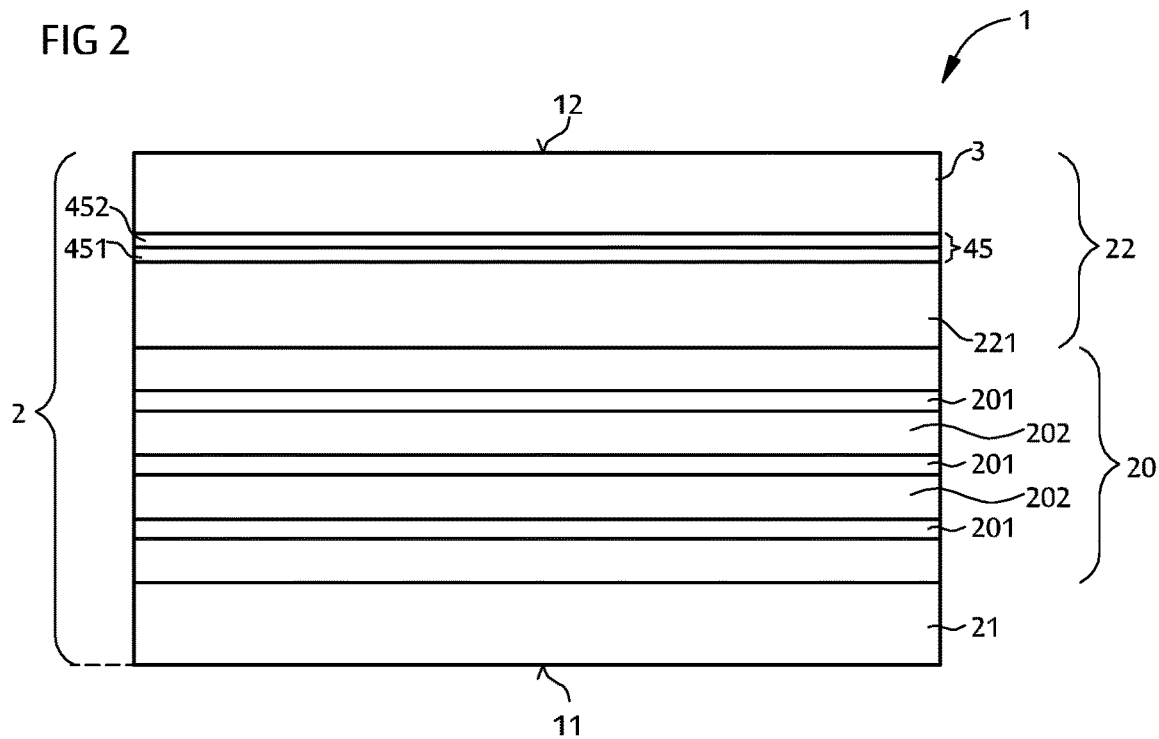
FIG. 2 shows another example of a semiconductor body.

FIG. 2 shows another example of a semiconductor body in a schematic cross-sectional view. This further example essentially corresponds to the example described in FIG. 1A.

In contrast, the p-conducting region 22 has a superlattice structure 45. The superlattice structure 45 is located between the current expansion layer 3 and the active region 20. In particular, the superlattice structure 45 is arranged between the current expansion layer 3 and the subregion 221. For example, the superlattice structure 45 has a plurality of first sublayers 451 and a plurality of second sublayers 452. For a simplified representation, only a first sublayer and a second sublayer are shown in FIG. 2. For example, GaP is suitable for the first sub-layer and AlInP for the second sub-layer.

By the superlattice structure, the danger of a continuation of lattice defects starting from the current expansion layer 3 in the direction of the active region 20 can be further reduced. Light loss caused by this can be avoided.

Overall, the semiconductor body described and a semiconductor chip formed with it are characterized by high moisture stability, low light loss and, at the same time, good current expansion due to high electrical conductivity and low absorption losses. In addition, the reliability of the semiconductor chip is improved due to improved adhesion of a dielectric layer to such a current expansion layer.

This application claims priority of DE 10 2017 104 719.0, the subject matter of which is incorporated herein by reference.

Our semiconductor bodies and chips are not limited by the description of the examples. Rather, this disclosure includes any new feature and any combination of features, that in particular includes any combination of features in the appended claims, even if the feature or combination itself is not explicitly mentioned in the claims or the examples.

The invention claimed is:

1. A radiation-emitting semiconductor body having a semiconductor layer sequence comprising an active region that generates radiation, an n-conducting region and a p-conducting region, wherein
   the active region is located between the n-conducting region and the p-conducting region;
   the p-conducting region comprises a current expansion layer based on a phosphide compound semiconductor material;
   the current expansion layer is doped with a first dopant incorporated at phosphorus lattice sites;
   the p-conducting region has a subregion between the current expansion layer and the active region, and the subregion is p-conductively doped with a second dopant different from the first dopant;
   a superlattice structure is disposed between the current expansion layer and the active region,
   the superlattice structure comprises a plurality of first sublayers and a plurality of second sublayers, the first sublayers and the second sublayers are formed from materials that are different from each other, and
   the first sublayers are formed with GaP and the second sublayers are formed with AlInP.

2. The radiation-emitting semiconductor body according to claim 1, wherein the first dopant is a Group IV element.

3. The radiation-emitting semiconductor body according to claim 1, wherein the first dopant is carbon.

4. The radiation-emitting semiconductor body according to claim 1, wherein the current expansion layer is lattice-mismatched with respect to a semiconductor material adjacent to a side facing the active region and is partially or completely relaxed.

5. The radiation-emitting semiconductor body according to claim 1, wherein the current expansion layer comprises $Al_xIn_yGa_{1-x-y}P$ with $0 \leq x \leq 0.05$ and $0 \leq y \leq 0.05$.

6. The radiation-emitting semiconductor body according to claim 5, wherein $x=0$ and $y=0$.

7. The radiation-emitting semiconductor body according to claim 1, wherein the second dopant is incorporated at Group III lattice sites.

8. A radiation-emitting semiconductor chip comprising the semiconductor body according to claim 1, wherein the semiconductor chip comprises a carrier on which the semiconductor body is disposed.

9. The radiation-emitting semiconductor chip according to claim 8, further comprising a mirror layer disposed between the carrier and the semiconductor body.

10. The radiation-emitting semiconductor chip according to claim 8, wherein the carrier is transparent to the radiation generated in the active region and, during operation of the semiconductor chip, at least some of the radiation exits through the carrier.

* * * * *